(12) United States Patent
Muldowney (10) Patent No.: US 10,440,853 B2
(45) Date of Patent: Oct. 8, 2019

(54) SYSTEM FOR MOVING AND/OR ROTATING MONITOR

(71) Applicant: FORD GLOBAL TECHNOLOGIES, LLC, Dearborn, MI (US)

(72) Inventor: Phillip Kerry Muldowney, Brighton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 288 days.

(21) Appl. No.: 15/214,576

(22) Filed: Jul. 20, 2016

(65) Prior Publication Data
US 2018/0027689 A1 Jan. 25, 2018

(51) Int. Cl.
*H05K 7/18* (2006.01)
*B60R 1/00* (2006.01)
*B60R 11/00* (2006.01)
*H05K 5/00* (2006.01)
*B60R 11/02* (2006.01)

(52) U.S. Cl.
CPC .............. *H05K 7/183* (2013.01); *B60R 1/00* (2013.01); *B60R 11/00* (2013.01); *B60R 11/0235* (2013.01); *H05K 5/0017* (2013.01); *B60R 2011/0028* (2013.01); *B60R 2011/0084* (2013.01); *B60R 2011/0089* (2013.01); *B60R 2011/0276* (2013.01)

(58) Field of Classification Search
CPC .................................................... H05K 7/183
See application file for complete search history.

(56) References Cited

U.S. PATENT DOCUMENTS

| | | | |
|---|---|---|---|
| 7,509,192 B2 | 3/2009 | Fukuro | |
| 7,894,003 B2 | 2/2011 | Chang | |
| 2001/0022553 A1 | 9/2001 | Pala et al. | |
| 2001/0048584 A1* | 12/2001 | Rosen | F16M 11/105 361/679.07 |
| 2005/0082862 A1* | 4/2005 | Anderson | B60R 7/04 296/37.7 |
| 2008/0029669 A1 | 2/2008 | Olah et al. | |
| 2010/0161220 A1* | 6/2010 | Masuda | B60R 11/02 701/532 |
| 2014/0354812 A1* | 12/2014 | Schafer | B60R 1/00 348/148 |
| 2016/0062117 A1* | 3/2016 | Imasaka | G02B 27/0101 345/7 |

* cited by examiner

*Primary Examiner* — Jefferey F Harold
*Assistant Examiner* — Justin B Sanders
(74) *Attorney, Agent, or Firm* — Vichit Chea; Price Heneveld LLP (57) ABSTRACT

A vehicle display system presents a display device in a motor vehicle provided with multiple seating positions and an interior headliner. The vehicle display system comprises a display device, a display device mounting bracket attached to the display device, the mounting bracket having a pair of pivots, each of the pivots being orthogonal to the other, and a plurality of mounting positions provided on the motor vehicle interior headliner. The display device is viewable by any one or any combination of a rearward facing second seating row occupant, a forward facing second seating row occupant, and a forward facing third seating row occupant.

18 Claims, 5 Drawing Sheets

SYSTEM FOR MOVING AND/OR ROTATING MONITOR

FIELD OF THE INVENTION

The present disclosure generally relates to a vehicle display system for presenting a display device in a motor vehicle provided with multiple seating positions and an interior headliner, and in particular a vehicle display system for moving and/or rotating a display device in a motor vehicle for improved viewing from multiple seat positions.

BACKGROUND OF THE INVENTION

Display devices are becoming more common and popular as applied to motor vehicles. In particular, such display devices are used to entertain and distract children (and some adults) during automobile trips, especially long automobile trips. Such display devices are typically mounted in the headliner along the centerline of the motor vehicle behind the first seating row, where the display device has a stowed and deployed position and where the display device may be folded down to the deployed position in a rearward facing overhead orientation. At same time, younger children are required to ride in rearward facing child restraint seats. Indeed, the ages in which such younger children are required to ride in such rearward facing child restraint seats is increasing. Moreover, such rearward facing child restraint seats are often required to be mounted in the second seating or rearward seating rows.

As a consequence, parents that are usually facing forward and situated in the front seating row find it more difficult to observe children restrained in rearward facing seating assemblies mounted in the second seating row and rearward seating rows. Also, the location and orientation of typical display devices puts the display device behind the head of rearward facing children and in a location and orientation where such rearward facing children cannot view the screen of such display devices until they are older and forward facing. An improvement over such display devices was desired.

SUMMARY OF THE INVENTION

According to one aspect of the present disclosure, a vehicle display system for presenting a display device in a motor vehicle provided with multiple seating positions and an interior headliner comprises a display device, a display device mounting bracket attached to the display device, the mounting bracket having a pair of pivots, each of the pivots being orthogonal to the other, and a plurality of mounting positions provided on the motor vehicle interior headliner.

According to another aspect of the present disclosure, a vehicle display system for presenting a display device in a motor vehicle provided with multiple seating positions and an interior headliner comprises a display device, a display device mounting bracket attached to the display device, the mounting bracket having a pair of pivots, each of the pivots being orthogonal to the other, and a plurality of mounting positions provided on the motor vehicle interior headliner. The display device is viewable by any one or any combination of a rearward facing second seating row occupant, a forward facing second seating row occupant, and a forward facing third seating row occupant.

According to yet another aspect of the present disclosure, a vehicle display system for presenting a display device in a motor vehicle provided with multiple seating positions and an interior headliner comprises a display device, a display device mounting bracket attached to the display device, the mounting bracket comprising a swivel mount having a pair of locking tabs disposed thereon in opposed relation to one another and extending orthogonally to an axis of the swivel mount, an intermediate portion rotationally coupled with the swivel mount about a vertical axis, a display device holder rotationally coupled with the intermediate portion about a horizontal axis, a positive and negative terminal disposed one on each of the locking tabs, and a plurality of mounting positions provided on the motor vehicle interior headliner, the mounting position comprising a fitted socket receiver mounted in the headliner, opposed recesses disposed in the socket receiver within which fittingly receive the locking tabs of the swivel mount, and within which the mounting bracket can be rotated to mount and lock the display device to the headliner, and a positive and a negative terminal disposed on opposed sides of socket receiver within which the base of the swivel mount is received that align with the positive and negative terminals in the mounting bracket when the mounting bracket is mounted and locked to the socket receiver.

These and other aspects, objects, and features of the present disclosure will be understood and appreciated by those skilled in the art upon studying the following specification, claims, and appended drawings.

DETAILED DESCRIPTION OF THE EMBODIMENTS

As referenced in the figures, the same reference numerals may be used herein to refer to the same parameters and components or their similar modifications and alternatives. For purposes of description herein, the terms "upper," "lower," "right," "left," "rear," "front," "vertical," "horizontal," and derivatives thereof shall relate to the present disclosure as oriented in FIG. 1. However, it is to be understood that the present disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise. The drawings referenced herein are schematic and associated views thereof are not necessarily drawn to scale.

Figure 1:
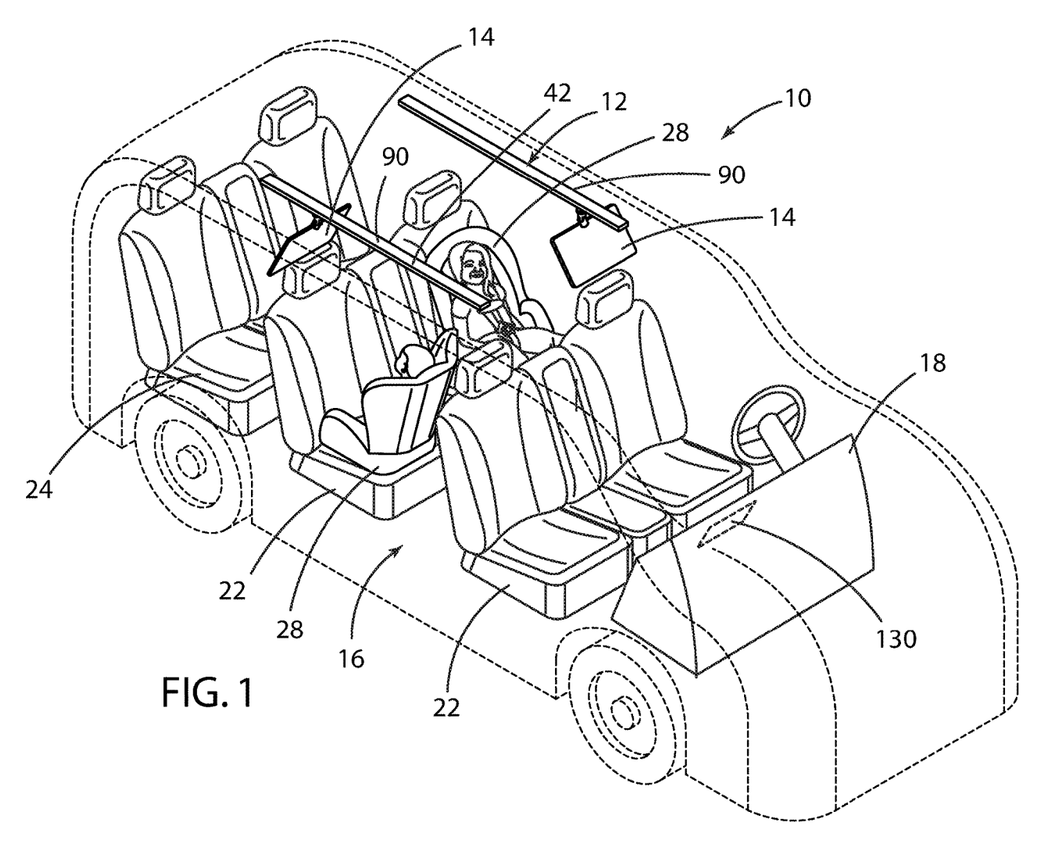
FIG. 1 is a front perspective view of a motor vehicle equipped with the vehicle display system of the present disclosure.
Figure 2:
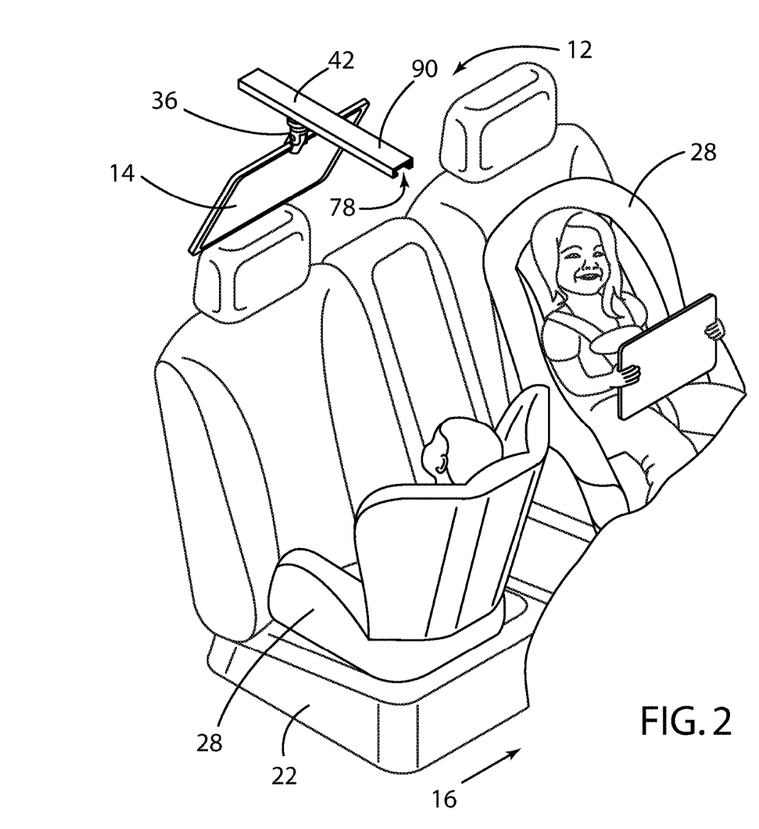
FIG. 2 is a front perspective view of second seating row of the motor vehicle of FIG. 1 according to the present disclosure.

Referring to FIGS. 1 and 2, reference numeral 10 generally designates a motor vehicle having the vehicle display system 12 for presenting a display device 14 in a motor vehicle 10 in accordance with the present disclosure. As shown, the motor vehicle 10 is provided with an interior passenger compartment 16 that is provided with an instrument panel 18, an interior headliner 20, and multiple seating positions 22, 24, 26. The multiple seating positions 22, 24, 26, are arranged in rows. The first seating row 22 is occupied by the driver and at least one passenger. The second seating row 24 and the third seating row 26 are designed to support and restrain passengers. As shown in the FIGS. 1 and 2, the second seating row 24 and third seating row 26 are adapted to support and restrain passengers, particularly adults and older children (sometimes also restrained by a child safety seat 28), in a forward facing orientation relative the front of the motor vehicle and, in the case of younger children further restrained by child safety seat 28, in a rearward facing orientation.

As shown in FIGS. 1 and 2, one or more display devices 14 are disposed within the motor vehicle 10 and mounted to the interior headliner 20 of the motor vehicle. The display devices 14 preferably comprise a substantially planar and rectangular housing 30 containing a screen 32 on a planar surface 34 thereof, such as a relatively flat and lightweight liquid crystal display (LCD) or light emitting diode (LED) screen 32. The display device is preferably a dedicated display, but could also be a handheld mobile device, such as an iPad.

As shown in the Figures, the display devices 14 are adapted to be placed in multiple positions relative the longitudinal length of the motor vehicle 10 and rotated about a vertical axis and a horizontal axis to provide visibility for occupants facing virtually any orientation and in any seating row, especially rearward facing occupants. In particular, the display device 14 can be oriented above or behind the second seating row 24 or third seating row 26 so that it may be viewed by a smaller child in a rearward facing child safety seat in the second seating row 24 or third seating row 26, respectively, but yet be moved forward and rotated to face rearward so that older children seated in the second seating row 24 or third seating row 26 and facing forward can see the display device 14, as best shown in FIG. 1.

The vehicle display system 12 of the present disclosure generally includes the display device 14, a display device mounting bracket 36 attached to the display device 14, the mounting bracket 36 having a pair of pivots 38, 40, each of the pivots 38, 40 being orthogonal to the other, and a plurality of mounting positions 42 provided on the interior headliner 20 of the motor vehicle 10. The mounting bracket 36 preferably comprises a swivel mount 44 having a vertical axis, a pair of locking tabs 48 disposed on the swivel mount 44 in opposed relation to one another and extending orthogonally to the vertical axis of the swivel mount 44, and an intermediate portion 52 rotationally coupled to the swivel mount 44 by a vertically oriented rotational pin 54 and bearing assembly 56 about the vertical axis.

The intermediate portion 52 is rotationally coupled to a display device holder 58 by a horizontally oriented rotational pin 60 about a horizontal axis. The intermediate portion 52 has a pair of vertically depending ears 62 on opposed sides thereof. The display device holder 58 has a centrally extending boss 64 which extends into and is fittingly received between the vertically depending ears 62 of the intermediate portion 52. Each of the vertically depending ears 62 is provided with a bearing opening 66 and the centrally extending boss 64 is provided with a transverse bore 68 extending there through, such that when the centrally extending boss 64 of the display device holder 58 is inserted and assembled with the vertically depending ears 62 of the intermediate portion 52, the vertical pin 54 can be inserted through the bearing openings 66 and the transverse bore 68 to provide the aforementioned pivotal connection. Preferably, a small gap is left between the intermediate portion 52 and the display device holder 58 proximate the centrally extending boss 64 to prevent binding and to allow free rotation. Further, it is preferred that a locking detent 70 be situated to engage a series of recesses 72 provided on the centrally extending boss 64. The locking detent 70 and the recesses 72 are preferably formed from a resilient material that allows the locking detent 70 to be readily moved from one recess 72 to the next when it is desired to rotate the display device 14 relative the horizontal access, while at the same time holding the display device 14 in whatever position is ultimately chosen. A similar locking device may be employed between the swivel mount 44 and intermediate portion 52 to prevent undesired rotation about the vertical axis. Alternatively, the abutting surfaces of the components can be joined together tightly so as to allow friction to adjustably lock the swivel mount 44, intermediate portion 52, and/or display device holder 58 to maintain a desired orientation one to the other.

Figure 7:
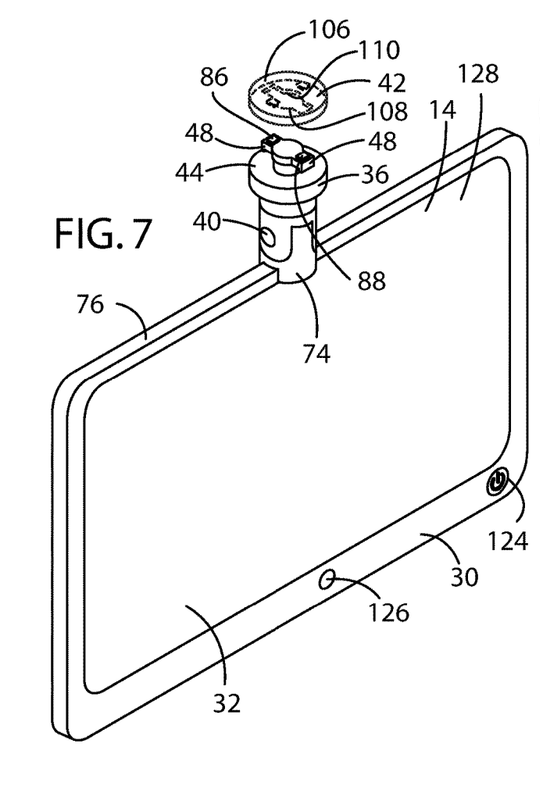
FIG. 7 is a cross-sectional side view of the first embodiment of the mounting position and mounting bracket of the vehicle display system according to the present disclosure in the unmounted and unlocked condition.

The display device holder 58 is preferably attached to display device 14 via a clamp 74 along an upper edge 76 of the display device, as shown in FIG. 7. While it is envisioned that the display device 14 is permanently attached to the display device holder 58 via the clamp 74, is likewise contemplated in the case of a personal mobility device being used as the display device 14, clamp 74 might be detachable.

Figure 4:
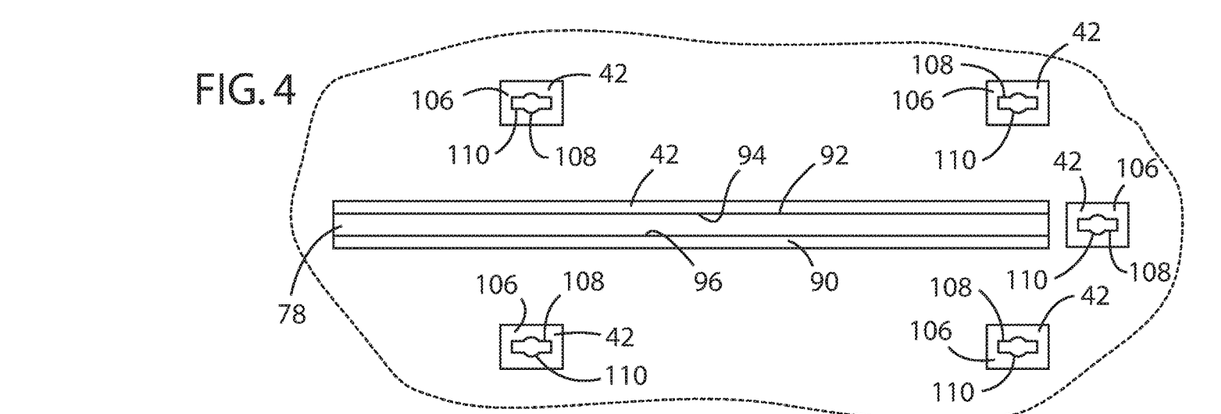
FIG. 4 is a bottom plan view of the vehicle display system according to the present disclosure.
Figure 5:
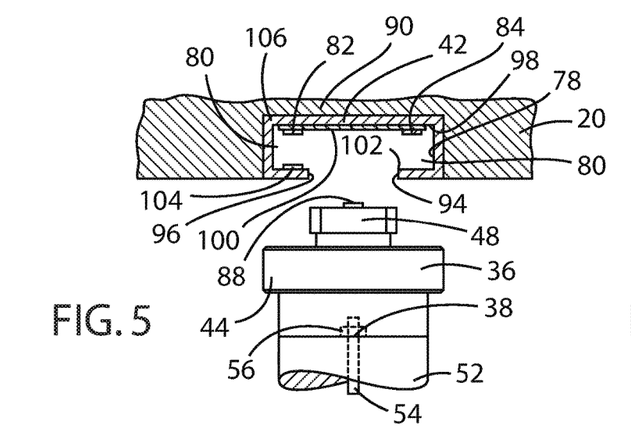
FIG. 5 is a cross-sectional side view of a first embodiment of the mounting position and mounting bracket of the vehicle display system according to the present disclosure in the unmounted and unlocked condition.
Figure 6:
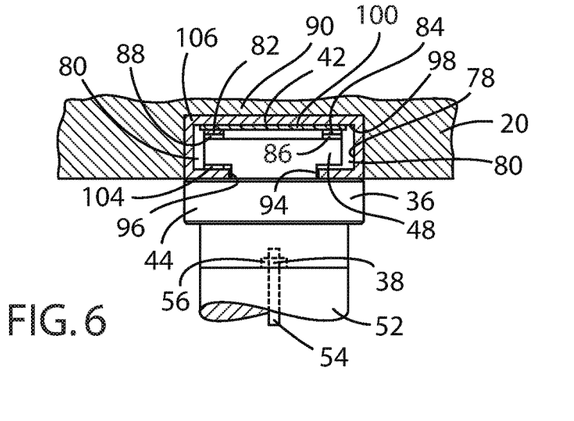
FIG. 6 is a cross-sectional side view of a first embodiment of the mounting position and mounting bracket of the vehicle display system according to the present disclosure in the mounted and locked condition.

As shown in FIGS. 4 through 6, the mounting positions 42 further comprise a fitted socket receiver 78 mounted in the interior headliner 20. The fitted socket receiver 78 of the mounting position 42 preferably is provided with opposed recesses 80 within which the locking tabs 48 of the swivel mount 44 are fittingly received, and within which the mounting bracket 36 can be rotated to mount and lock the display device 14 to the headliner 20, as shown in FIGS. 5, 6, 8, and 9. In order to provide electrical power, the socket receiver 78 also preferably includes a positive and a negative terminal 82, 84 disposed on opposite sides of the socket receiver 78 within which the swivel mount 44 is received. The swivel mount 44 also preferably includes a positive and negative terminal 86, 88 disposed one on each of the locking tabs 48 that align with the positive and negative terminals 82, 84 in the socket receiver 78 when the mounting bracket 36 is mounted to and locked within the socket receiver 78.

A connection for a data source (not shown), as described further below, could also be similarly provided with aligned terminals in each of the swivel mount 44 and the socket receiver 78. That is, a data source by which a visual and/or audio output can be provided to the display device 14 by a wired system through the socket receiver 78 to the mounting bracket 36.

By virtue of the swivel mount 44 being mounted via the vertical pin 54, the display device 14 is rotatable 360° about an axis perpendicular to the interior headliner 20. Similarly, by virtue of the intermediate portion 52 being mounted to the display device holder 58 via the horizontal pin 60, the display device 14 is rotatable within an arc of 180° about an axis parallel to the interior headliner 20. That is, the display device 14 can be flipped upward in either direction so that it is essentially parallel with the interior headliner 20, as shown in FIG. 3.

Figure 3:
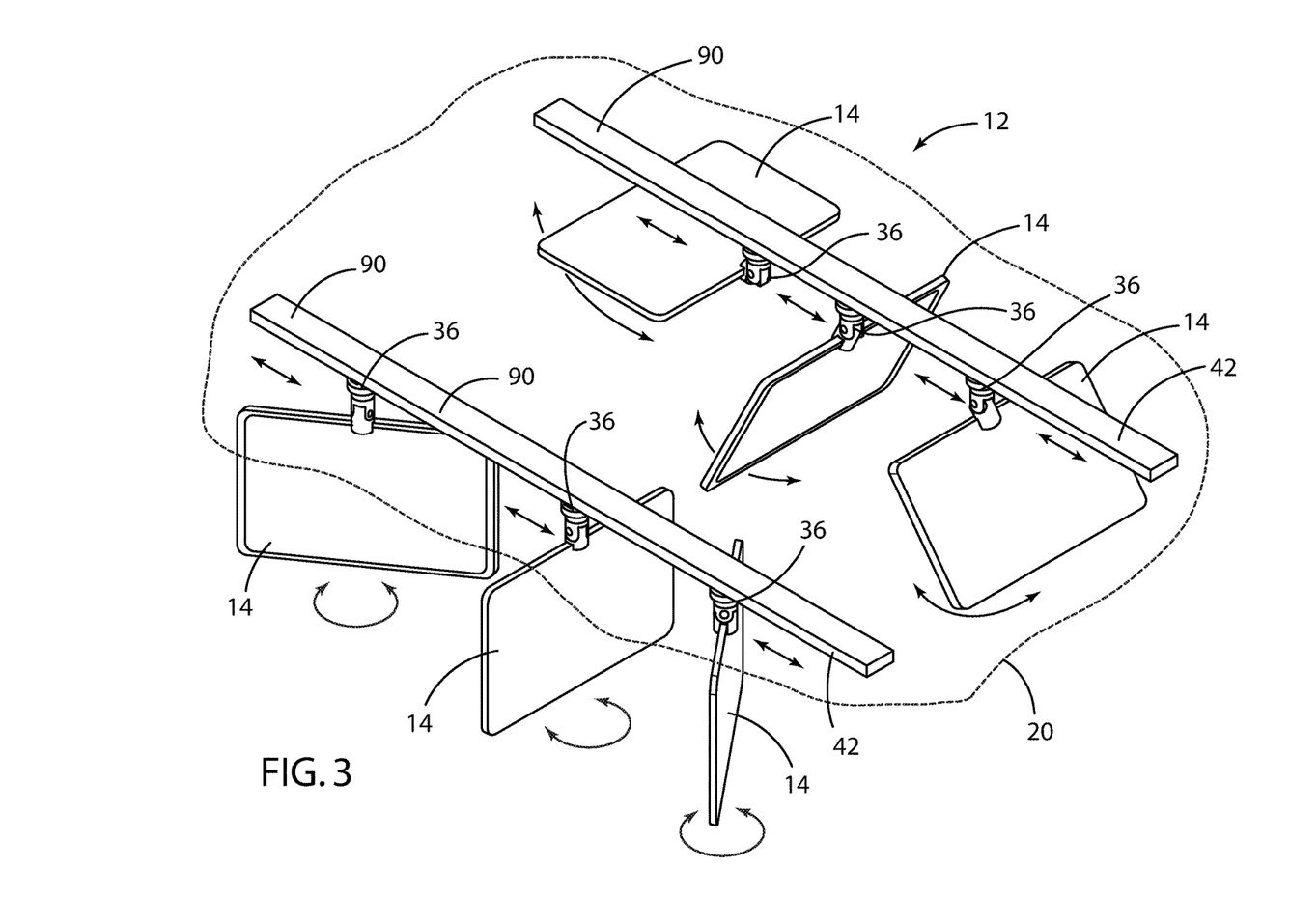
FIG. 3 is a front perspective view of the vehicle display system according to the present disclosure.

As shown in FIGS. 1 through 6, the mounting positions 42 may comprise one or more rails 90 extending substantially along a longitudinal length of the interior headliner 20 within which the mounting bracket 36 is received. Preferably, a pair of rails 90 is provided on either side of the centerline of the motor vehicle 10, as shown in FIG. 1. By using a rail 90, the display device 14 is capable of being disposed anywhere along the longitudinal length of the rail 90 and the interior headliner 20. Alternatively, a single rail 90 may be disposed along the centerline of the motor vehicle 10. Also, it should be noted that multiple display devices 14 may be disposed anywhere along the longitudinal length of any particular single rail 90, as shown in FIG. 3.

The rail 90 is shown in cross-sectional detail in FIGS. 5 and 6 to expose the fitted socket receiver 78 mounted in the interior headliner 20. The fitted socket receiver 78 of the rail 90 includes a slot 92 and opposed edges 94, 96 on either side of the slot 92 extending along the length of the rail 90. An upper wall 98 in the rail 90 is provided with a resilient layer 100 disposed on a lower surface 102 thereof, and the positive and a negative terminal 82, 84 disposed on opposite sides of the socket receiver 78 within which the swivel mount 44 is received are situated proximate the resilient layer 100. The upper wall 98 and the opposed edges 94, 96 on either side of the rail 90 form the opposed recesses 80 within which the locking tabs 48 of the swivel mount 44 are fittingly received. That is, as shown in FIGS. 5 and 6, as the locking tabs 48 of the swivel mount 44 are inserted into the slot 92 and the swivel mount 44 is rotated approximately 90°, the tabs 48 of the swivel mount 44 deform the resilient layer 100 to form a positive engagement within the socket receiver 78. Optionally, a stop 104 can be provided within the socket receiver 78 to positively locate the locking tabs 48 in a 90° angle to the slot 92. Thus, the mounting bracket 36 can be rotated to mount and lock the display device 14 to the interior headliner 20, as shown in FIGS. 5, 6, 8, and 9. The positive and negative terminal 86, 88 disposed one on each of the locking tabs 48 align with the positive and negative terminals 82, 84 in the socket receiver 78 when the mounting bracket 36 is mounted to and locked within the socket receiver 78.

Alternatively, the plurality of mounting positions 42 can comprise a plurality of discrete mounting access points 106 disposed at predetermined locations within the interior headliner 20, as shown in FIG. 4, which shows substantially rectangular configured access points 106. However, as shown in FIG. 7, the access points 106 can have a circular configuration. In either case, as shown in side cross-sectional view of FIGS. 8 and 9, access points 106 includes an elongated opening 108 with an enlarged center portion 110.

Figure 8:
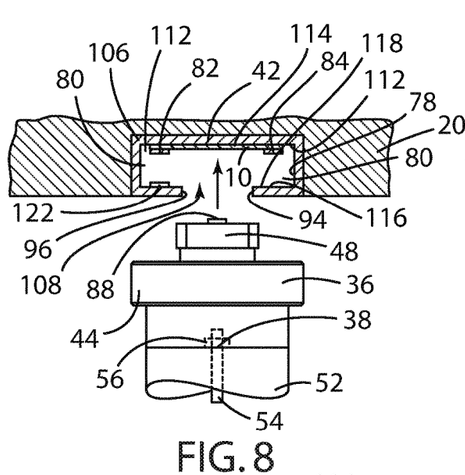
FIG. 8 is a cross-sectional side view of a second embodiment of the mounting position and mounting bracket of the vehicle display system according to the present disclosure in the unmounted and unlocked condition.
Figure 9:
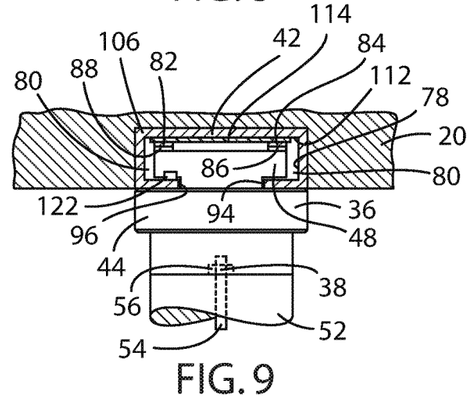
FIG. 9 is a cross-sectional side view of the second embodiment of the mounting position and mounting bracket of the vehicle display system according to the present disclosure in the unmounted and unlocked condition.
Figure 10:
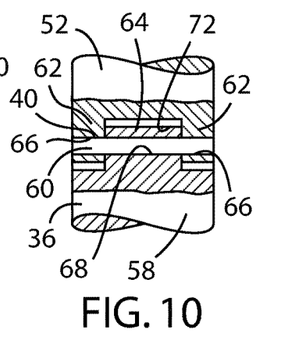
FIG. 10 is a cross-sectional front view of the mounting bracket of the present disclosure.
Figure 11:
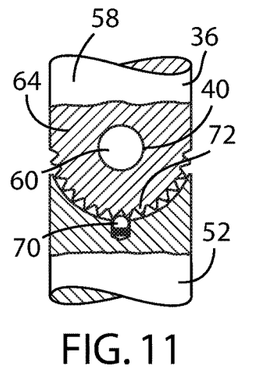
FIG. 11 is a cross-sectional side view of the mounting bracket of the present disclosure.

An upper wall 112 in the access points 106 is similarly provided with a resilient layer 114 on a lower surface 116 thereof and the positive and a negative terminal 82, 84 disposed on opposite sides of the socket receiver 78 within which the base 46 of the swivel mount 44 is received are situated proximate the resilient layer 114. The upper wall 112 and a portion 118 of a lower wall 120 of the access points 106 form the opposed recesses 80 within which the locking tabs 48 of the swivel mount 44 are fittingly received. That is, as shown in FIGS. 8 and 9, as the locking tabs 48 of the swivel mount 44 are inserted into the opening 108 and the swivel mount 44 is rotated approximately 90°, the locking tabs 48 of the swivel mount 44 deform the resilient layer 114 to form a positive engagement within the socket receiver 78. Again, a stop 122 can be provided within the socket receiver 78 to positively locate the locking tabs 48 in a 90° angle to the elongated opening 108. The positive and negative terminals 86, 88 disposed one on each of the locking tabs 48 align with the positive and negative terminals 82, 84 in the socket receiver 78.

In either configuration, the plurality of mounting positions 42 advantageously and preferably provides a power source for the display device 14.

Preferably, the instrument panel 18 of the motor vehicle 10 is incorporated with the vehicle display system 12 of the present disclosure. A first desirable feature is that the display device 14 includes an on-off control 124, and that on-off control 124 is operably connected with the instrument panel 18 for control of the display device 14 from the instrument panel 18.

An additional desirable feature that may be incorporated into the vehicle display system 12 of the present disclosure is the use of a local wireless network that may be available in the motor vehicle. For example, if the motor vehicle 10 is provided with a local wireless network and the display device 14 is enabled with a wireless receiver, data may be transferred to and from the display device 14 via a wireless network. Alternatively, if the motor vehicle 10 is provided with a Bluetooth communication system and the display device 14 is operably connected with the motor vehicle 10 via the Bluetooth communication system, data may be transferred to and from the display device 14 via the Bluetooth communication system. It is further contemplated that the data source for the display device 14 might include an instrument panel 18 mounted digital versatile disc (DVD) player receiver, a console mounted entertainment center having any of a DVD, Blu-Ray, or gaming system, or a personal computing device of an occupant.

Preferably, the display device 14 includes a camera 126 disposed on the face 128 of the display device 14 that bears the screen 32. The camera 126 provides an image signal that can be directed to a second display device 130 mounted on the instrument panel 18. Thus, the camera 126 on the display device 14 can capture an image that is accessible from the first seating row 22 of the motor vehicle 10 via the second display device 130 mounted to an instrument panel 18. Alternatively, an image might be accessible from a smart device, such as an iPhone or iPad.

More preferentially, such camera 126 integration would allow occupants in the first seating row 22 to activate and view the camera signal in a smartphone application or via the second display screen 130 mounted on the instrument panel 18. With the camera 126 disposed on the face 128 of the display device 14 that bears the screen 32, occupants that are disposed to view the display device 14 can themselves be observed. This is particularly advantageous in the case of a rearward facing child in a rearward facing child safety seat 28 supported and restrained in the second seating row 24 or third seating row 26. Integration of the camera 126 through a commercially available iPad or similar device that is not dedicated to the motor vehicle 10, coupled with a mobile application for such mobile personal computing devices, might an aftermarket solution not integrated into the motor vehicle 10. Additionally, the video feed out of the display device 14 may be viewable by an occupant in the first seating row 22 on the second display device 130 mounted on the instrument panel 18 or viewable by an occupant having a remote network device.

As is apparent by the present disclosure, the vehicle display system 12 provides a display device 14 that is viewable by any of a rearward facing occupant in the second seating row 24, a forward facing occupant in the second seating row 24, and a forward facing occupant in the third seating row 26. Further, the vehicle display system 12 may include a plurality of display devices 14, as shown in FIGS. 1 and 2, particularly where the data source derives from the Bluetooth connection between the display device 14 and the motor vehicle 10. In such case, each of the display devices 14 can be individually paired to the motor vehicle 10 through a unique Bluetooth connection, and individual streaming of data can be provided to each of the display devices 14.

It will be understood by one having ordinary skill in the art that construction of the described present disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

For purposes of this disclosure, the term "operably connected" generally means that one component functions with respect to another component, even if there are other components located between the first and second component, and the term "operable" defines a functional relationship between components.

It is also important to note that the construction and arrangement of the elements of the present disclosure as shown in the exemplary embodiments is illustrative only. Although only a few embodiments of the present innovations have been described in detail in this disclosure, those skilled in the art who review this disclosure will readily appreciate that, unless otherwise described, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating positions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A vehicle display system for presenting a display device in a motor vehicle provided with multiple seating positions and an interior headliner, the vehicle display system comprising:
    a display device;
    a plurality of mounting positions provided on the motor vehicle interior headliner, each of the plurality of mounting positions comprising a fitted socket receiver mounted in or on the headliner, a pain of opposed recesses disposed in the socket receiver, a positive terminal disposed on one of the pair of opposed recesses of the socket receiver, and a negative terminal disposed on the other of the pair of the opposed recesses of the socket receiver; and
    a display device mounting bracket attached to the display device, the display device mounting bracket comprising:
        a pair of pivots, each of the pivots being orthogonal to the other;
        a swivel mount oriented about a vertical axis and having a pair of outwardly extending locking tabs disposed thereon in opposed relation to each other and extending orthogonally relative a vertical axis of the swivel mount and a positive and negative terminal disposed one on each of the locking tabs, wherein the pair of opposed recesses of the socket receiver of each of the plurality of mounting positions fittingly receives the pair of locking tabs of the swivel mount, and within which the mounting bracket can be rotated to mount and lock the display device to the headliner, such that the positive terminal disposed on one of the pair of locking tabs is aligned with and in electrical communication with the positive terminal on one of the pair of socket receivers and the negative terminal disposed on the other of the pair of locking tabs is aligned with and in electrical communication with the negative terminal on the other of the pair of socket receivers when the mounting bracket is mounted and locked to the socket receiver;
        an intermediate portion rotationally coupled with the swivel mount about the vertical axis; and a display device holder rotationally coupled with the intermediate portion about a horizontal axis and to which the display device is attached.

2. The vehicle display system of claim 1, wherein the display device is rotatable 360° about an axis perpendicular to the interior headliner.

3. The vehicle display system of claim 1, wherein the display device is rotatable within an arc of 180° about an axis parallel to the interior headliner.

4. The vehicle display system of claim 1, wherein the mounting positions comprise a rail extending substantially along a longitudinal length of the interior headliner within which the mounting bracket is received.

5. The vehicle display system of claim 4, wherein the display device is adapted to be disposed anywhere along the longitudinal length of the rail in the interior headliner.

6. The vehicle display system of claim 1, further comprising a plurality of discrete access points disposed at predetermined locations within the interior headliner.

7. The vehicle display system of claim 1, wherein the display device includes an on-off control, and wherein the on-off control is operably connected with an instrument panel for control of the display device from the instrument panel.

8. The vehicle display system of claim 1, wherein the mounting position further comprises a power source for the display device.

9. The vehicle display system of claim 1, wherein a data source by which a visual and/or audio output provided by the display device is supplied through the socket receiver to the mounting bracket.

10. The vehicle display system of claim 1, wherein the motor vehicle is provided with a wireless network or Bluetooth communication system and the display device is operably connected with the wireless network or operably connected with the motor vehicle via the Bluetooth communication system, respectively.

11. The vehicle display system of claim 1, wherein the display device includes a camera.

12. The vehicle display system of claim 11, wherein an image captured by the camera is accessible from a first seating row of the motor vehicle via a second display device mounted to an instrument panel of the motor vehicle or is accessible from a smart device.

13. The vehicle display system of claim 1, wherein the display device is viewable by a rearward facing second seating row occupant.

14. The vehicle display system of claim 1, wherein the display device is viewable by a forward facing second seating row occupant.

15. The vehicle display system of claim 1, wherein where the display device is viewable by a forward facing third seating row occupant.

16. The vehicle display system of claim 1, wherein the system comprises a plurality of display devices.

17. A vehicle display system for presenting a display device in a motor vehicle provided with multiple seating positions and an interior headliner, the vehicle display system comprising a display device, a display device mounting bracket attached to the display device, the mounting bracket having a pair of pivots, each of the pivots being orthogonal to the other, and a plurality of mounting positions provided on or in the motor vehicle interior headliner, wherein the display device is viewable by any one or any combination of a rearward facing second seating row occupant, a forward facing second seating row occupant, and a forward facing third seating row occupant, wherein the mounting bracket comprises a swivel mount oriented about a vertical axis and having a pair of outwardly extending locking tabs disposed thereon in opposed relation to one another and extending orthogonally relative a vertical axis of the swivel mount, an intermediate portion rotationally coupled with the swivel mount about the vertical axis, and a display device holder rotationally coupled with the intermediate portion about a horizontal axis, and the mounting position comprises a fitted socket receiver mounted in the headliner, the mounting position having opposed recesses in the socket receiver within which fittingly receive the locking tabs of the swivel mount, and within which the mounting bracket can be rotated to mount and lock the display device to the headliner.

18. A vehicle display system for presenting a display device in a motor vehicle provided with multiple seating positions and an interior headliner, the vehicle display system comprising:

a display device;

a display device mounting bracket attached to the display device, the mounting bracket comprising a swivel mount and having a pair of outwardly extending locking tabs disposed thereon in opposed relation to one another and extending orthogonally to an axis of the swivel mount, an intermediate portion rotationally coupled with the swivel mount about a vertical axis, a display device holder rotationally coupled with the intermediate portion about a horizontal axis, and a positive and negative terminal disposed one on each of the locking tabs; and a plurality of mounting positions provided on or in the interior headliner, the mounting positions each comprising a fitted socket receiver mounted in the headliner, opposed recesses disposed in the socket receiver within which fittingly receive the locking tabs of the swivel mount, and within which the mounting bracket can be rotated to mount and lock the display device to the headliner, and a positive and a negative terminal disposed on opposed sides of socket receiver within which the base of the swivel mount is received that align with the positive and negative terminals in the mounting bracket when the mounting bracket is mounted and locked to the socket receiver.

* * * * *

UNITED STATES PATENT AND TRADEMARK OFFICE
CERTIFICATE OF CORRECTION

PATENT NO. : 10,440,853 B2  
APPLICATION NO. : 15/214576  
DATED : October 8, 2019  
INVENTOR(S) : Muldowney Page 1 of 1

It is certified that error appears in the above-identified patent and that said Letters Patent is hereby corrected as shown below:

In the Claims

Column 8:
Claim 1, Line 35:
"pain" should be --pair--.

Signed and Sealed this
Seventeenth Day of December, 2019

Andrei Iancu
*Director of the United States Patent and Trademark Office*